United States Patent
Xie et al.

(10) Patent No.: US 10,199,480 B2
(45) Date of Patent: Feb. 5, 2019

(54) CONTROLLING SELF-ALIGNED GATE LENGTH IN VERTICAL TRANSISTOR REPLACEMENT GATE FLOW

(71) Applicant: GLOBALFOUNDRIES Inc., Grand Cayman (KY)

(72) Inventors: Ruilong Xie, Schenectady, NY (US); Tenko Yamashita, Schenectady, NY (US); Kangguo Cheng, Schenectady, NY (US); Chun-Chen Yeh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 15/280,451

(22) Filed: Sep. 29, 2016

(65) Prior Publication Data

US 2018/0090598 A1  Mar. 29, 2018

(51) Int. Cl.
*H01L 29/08* (2006.01)
*H01L 29/66* (2006.01)
(Continued)

(52) U.S. Cl.
CPC .... *H01L 29/66666* (2013.01); *H01L 21/0332* (2013.01); *H01L 21/0337* (2013.01);
(Continued)

(58) Field of Classification Search
CPC ............ H01L 29/66666; H01L 27/088; H01L 21/0337; H01L 21/0332; H01L 29/41741;
(Continued)

(56) References Cited

U.S. PATENT DOCUMENTS 6,406,962 B1  6/2002  Agnello
6,667,143 B2  12/2003  Nirmal
(Continued)

OTHER PUBLICATIONS

U.S. Appl. No. 15/280,521, filed Sep. 29, 2017.
(Continued)

*Primary Examiner* — Steven H Loke
*Assistant Examiner* — Juanita B Rhodes
(74) *Attorney, Agent, or Firm* — Heslin Rothenberg Farley & Mesiti P.C.; Nathan B. Davis

(57) ABSTRACT

A semiconductor structure includes a semiconductor substrate, a bottom source/drain layer for a first vertical transistor over the semiconductor substrate, a vertical channel over the source/drain layer, and a metal gate wrapped around the vertical channel, the vertical channel having a fixed height relative to the metal gate at an interface therebetween. The semiconductor structure further includes a top source/drain layer over the vertical channel, and a self-aligned contact to each of the top and bottom source/drain layer and the gate. The semiconductor structure can be realized by providing a semiconductor substrate with a bottom source/drain layer thereover, forming a vertical channel over the bottom source/drain layer, forming a dummy gate wrapped around the vertical channel, and forming a bottom spacer layer and a top spacer layer around a top portion and a bottom portion, respectively, of the vertical channel, a remaining center portion of the vertical channel defining a fixed vertical channel height. The method further includes forming a top source/drain layer over the vertical channel, replacing the dummy gate with a metal gate, and forming self-aligned source, drain and gate contacts.

13 Claims, 17 Drawing Sheets

(51) Int. Cl.
  *H01L 29/78*    (2006.01)
  *H01L 21/033*   (2006.01)
  *H01L 27/088*   (2006.01)
  *H01L 29/417*   (2006.01)

(52) U.S. Cl.
  CPC ...... *H01L 27/088* (2013.01); *H01L 29/66545* (2013.01); *H01L 29/7827* (2013.01); *H01L 29/0847* (2013.01); *H01L 29/41741* (2013.01)

(58) Field of Classification Search
  CPC ............. H01L 29/6656; H01L 29/0847; H01L 29/1037; H01L 29/66545; H01L 29/7827; H01L 29/66712; H01L 29/66742; H01L 29/42356; H01L 29/7802
  See application file for complete search history.

(56) References Cited

U.S. PATENT DOCUMENTS

| | | |
|---|---|---|
| 6,690,040 B2 | 2/2004 | Chaudhry |
| 6,709,904 B2 | 3/2004 | Chaudhry |
| 2002/0060338 A1 | 5/2002 | Zhang |
| 2003/0047749 A1 | 3/2003 | Chaudhry |
| 2003/0064567 A1 | 4/2003 | Chaudhry |
| 2004/0219725 A1* | 11/2004 | Furukawa ......... H01L 21/76897 438/197 |
| 2008/0296677 A1* | 12/2008 | Takaishi ........... H01L 29/66666 257/336 |
| 2009/0057780 A1* | 3/2009 | Wong .................... H01L 21/845 257/401 |
| 2010/0078718 A1* | 4/2010 | Blank .................. H01L 29/407 257/331 |
| 2014/0042504 A1* | 2/2014 | Masuoka ................ H01L 29/78 257/288 |
| 2014/0239420 A1* | 8/2014 | Basker ............. H01L 29/66803 257/412 |
| 2016/0365439 A1* | 12/2016 | Lin ................... H01L 29/42392 |

OTHER PUBLICATIONS

Notice of Allowance and Fee(s) Due dated Mar. 14, 2017 for U.S. Appl. No. 15/280,521, filed Sep. 29, 2017.

Hergenrother, J.M., et al., "The Vertical Replacement-Gate (VRG) MOSFET: A 50-nm Vertical MOSFET with Lithography-Independent Gate Length," Bell Laboratories, Lucent Technologies, Murray Hill, NJ 07094 USA, IEEE, 1999, 4 pages.

Hergenrother, J.M., et al., "The vertical replacement-gate (VRG) MOSFET," Agere Systems, Murray Hill, NJ 07094 USA, Elsevier Science Ltd., 2001, 12 pages.

* cited by examiner

… (1)

CONTROLLING SELF-ALIGNED GATE LENGTH IN VERTICAL TRANSISTOR REPLACEMENT GATE FLOW

BACKGROUND OF THE INVENTION

Technical Field

The present invention generally relates to fabrication of vertical transistors. More specifically, the present invention relates to controlling self-aligned gate length in a vertical transistor with replacement gate fabrication process.

Background Information

Currently, fabrication of vertical FETs (VFETs) is challenging in regards to controlling the self-aligned gate width and integrating the VFETs into a replacement metal gate (RMG) process flow.

SUMMARY OF THE INVENTION

Thus, a need exists to overcome the challenges noted above.

The shortcomings of the prior art are overcome and additional advantages are provided through the provision, in one aspect, of a method of controlling self-aligned gate length in a vertical transistor replacement gate fabrication process. The method includes providing a starting semiconductor structure, the starting semiconductor structure comprising a substrate with a bottom source/drain layer thereover and a vertical channel over the bottom source/drain layer, the vertical channel being part of a fin over the bottom source/drain layer, the fin including a bottom portion of semiconductor channel material and a top portion of sacrificial epitaxial semiconductor material. The method further includes forming a dummy gate wrapped around the vertical channel, and forming a bottom spacer layer and a top spacer layer around a top portion and a bottom portion, respectively, of the vertical channel, a remaining center portion of the vertical channel defining a fixed vertical channel height. The method further includes forming a top source/drain layer over the vertical channel, replacing the dummy gate with a metal gate, and forming self-aligned source, drain and gate contacts.

In accordance with another aspect, a semiconductor structure is provided. The semiconductor structure includes a semiconductor substrate, a bottom source/drain layer for a first vertical transistor over the semiconductor substrate, a fin coupled to the bottom source/drain layer, the fin comprising a vertical channel over the bottom source/drain layer, the vertical channel occupying less than all of the fin, and a metal gate wrapped around the vertical channel, the vertical channel having a fixed height relative to the metal gate at an interface therebetween. The semiconductor structure further includes a top source/drain layer over the vertical channel, and a self-aligned contact to each of the top and bottom source/drain layer and the metal gate.

These, and other objects, features and advantages of this invention will become apparent from the following detailed description of the various aspects of the invention taken in conjunction with the accompanying drawings.

DETAILED DESCRIPTION OF THE INVENTION

Figure 1:
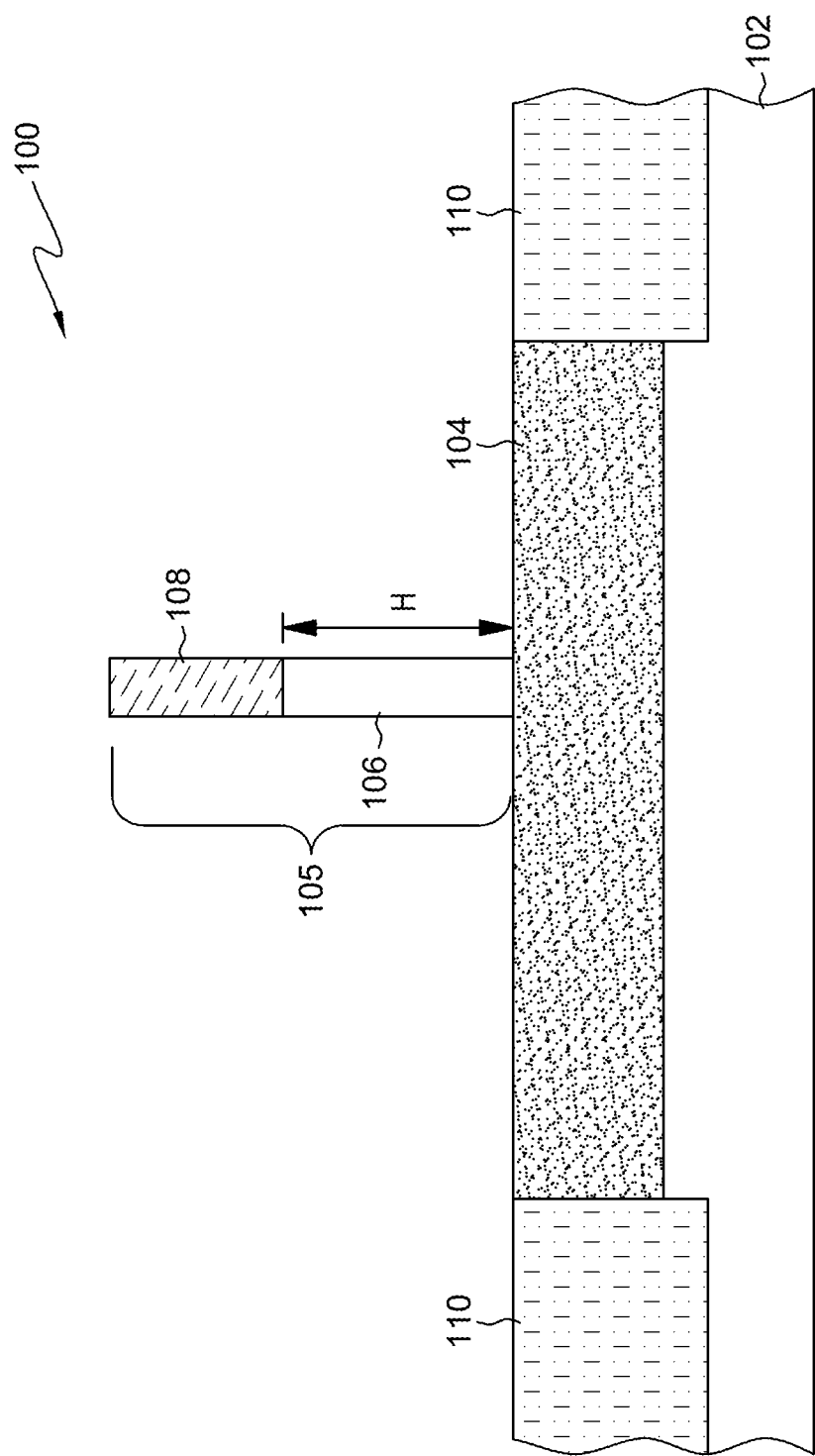
FIG. 1 is a cross-sectional view of one example of a starting semiconductor structure, the starting semiconductor structure including a semiconductor substrate with a layer of doped source/drain semiconductor material over the semiconductor substrate, isolation material layers on either side of the layer of doped source/drain semiconductor material and partially extending into the semiconductor substrate, and at least one fin over the doped source/drain semiconductor material, the fin(s) including a bottom portion of a semiconductor channel material and a top portion of a sacrificial epitaxial material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the starting semiconductor structure including a semiconductor substrate 102 with a layer of doped source/drain semiconductor material 104 over the semiconductor substrate, isolation material layers 110 on either side of the layer of doped source/drain semiconductor material and partially extending into the semiconductor substrate, and fin(s) 105 over the doped source/drain semiconductor material, the fin(s) including a bottom portion 106 of a semiconductor channel material and a top portion 108 of a sacrificial epitaxial material, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
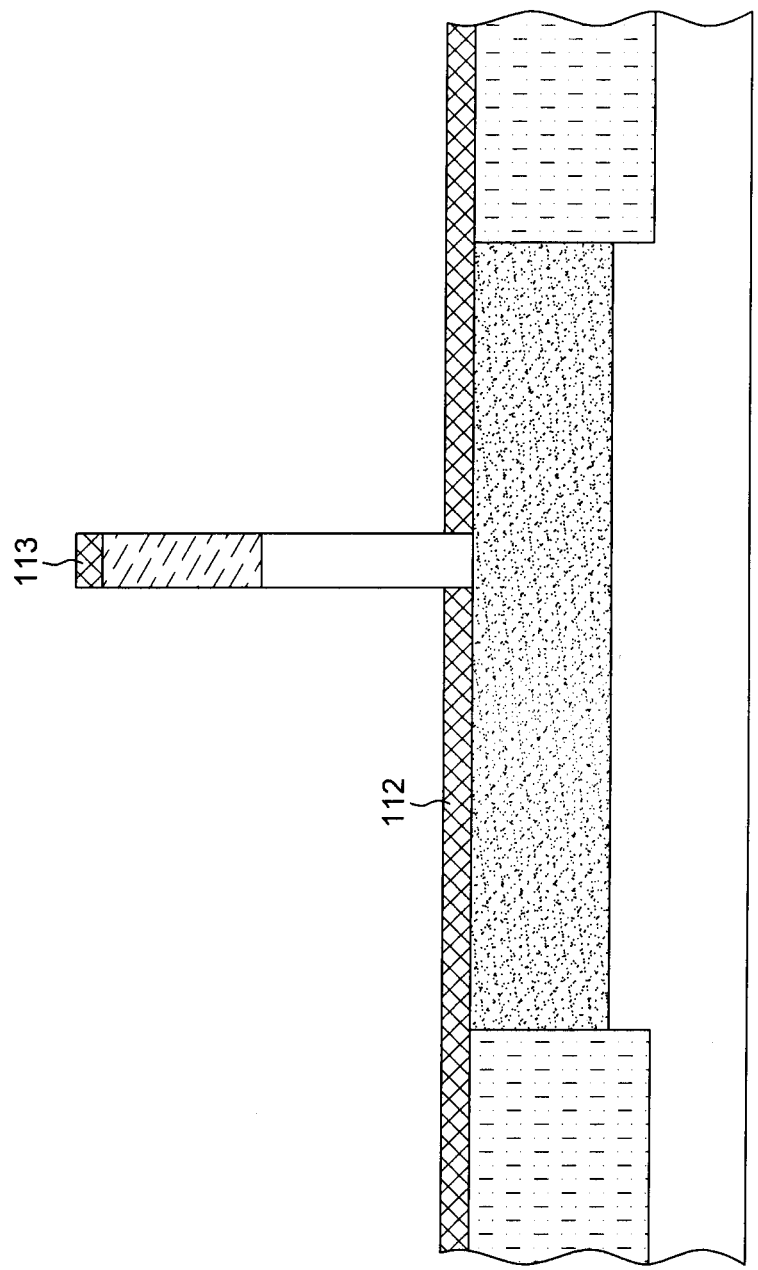
FIG. 2 depicts one example of the structure of FIG. 1 after forming a bottom spacer layer and a top spacer layer for a vertical transistor on horizontal surfaces of the starting semiconductor structure (e.g., using a gas cluster ion beam process), in accordance with one or more aspects of the present invention.

FIG. 2 depicts one example of the structure of FIG. 1 after forming a bottom spacer layer 112 and top spacer layer 113 (spacer for a vertical transistor) on horizontal surfaces of the starting semiconductor structure (e.g., using a gas cluster ion beam (GCIB) process), in accordance with one or more aspects of the present invention. Since the spacer layer is formed by a directional deposition process, it is formed only at the bottom surface and the top surface of the FIN. Examples of directional deposition include: (1) GCIB deposition of SiN; or (2) HDP deposition of SiO2, or SiN. (HDP: High-Density Plasma CVD, which typically includes multiple dep-etch cycles and eventually formed dielectric material at the bottom without forming any at the sidewalls.)

Figure 3:
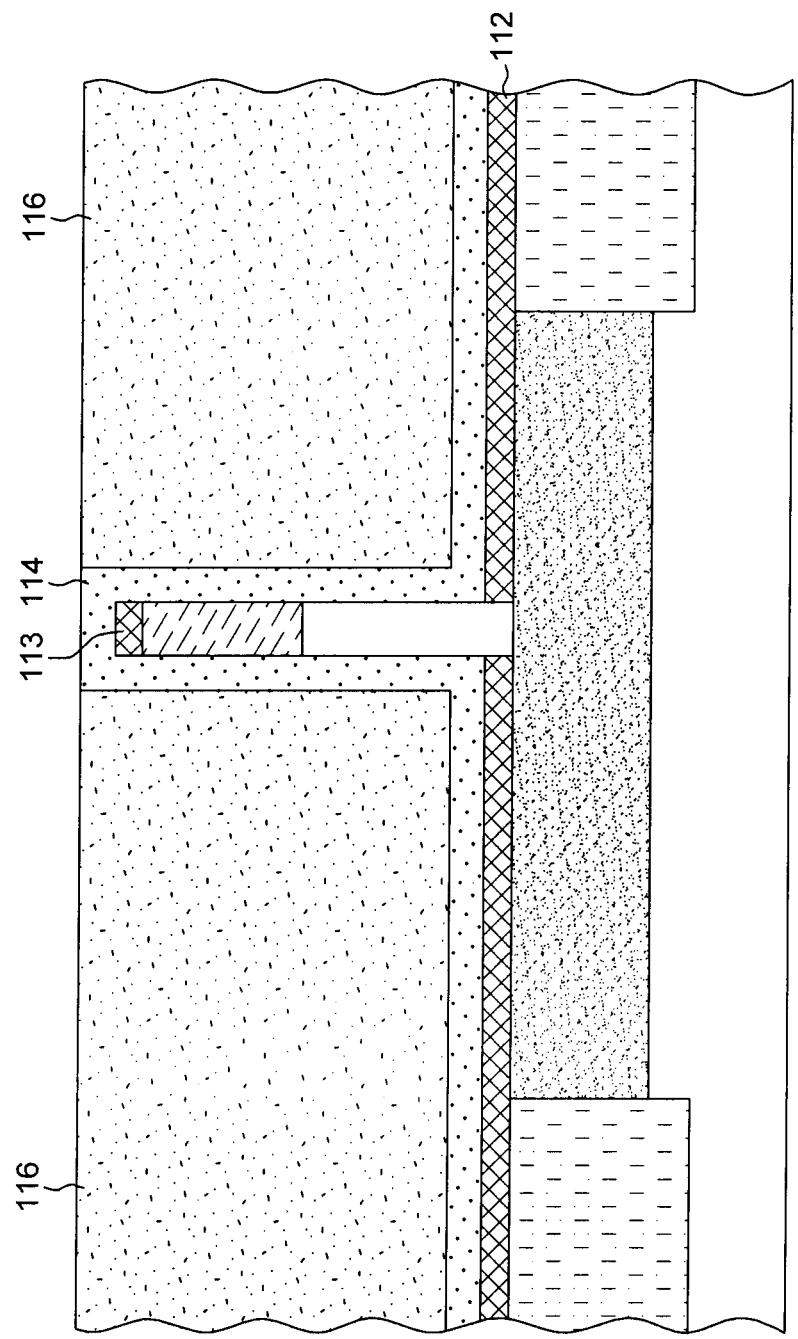
FIG. 3 depicts one example of the structure of FIG. 2 after forming a conformal dielectric layer over the first hard mask layer and sides of the at least one fin, and forming a dummy gate adjacent to vertical portions of the conformal dielectric layer, followed by planarization (e.g., CMP) to polish the dummy gate material down to the conformal dielectric layer, in accordance with more or more aspects of the present invention.

FIG. 3 depicts one example of the structure of FIG. 2 after forming a conformal dielectric layer 114 over the bottom spacer layer 112 and sides of the at least one fin and forming a dummy gate 116 adjacent to vertical portions of the conformal dielectric layer, followed by planarization (e.g., CMP) to polish the dummy gate material 116 down to the conformal dielectric layer, in accordance with more or more aspects of the present invention. Example of materials include: 114: SiO2, 116: a-Si.

Figure 4:
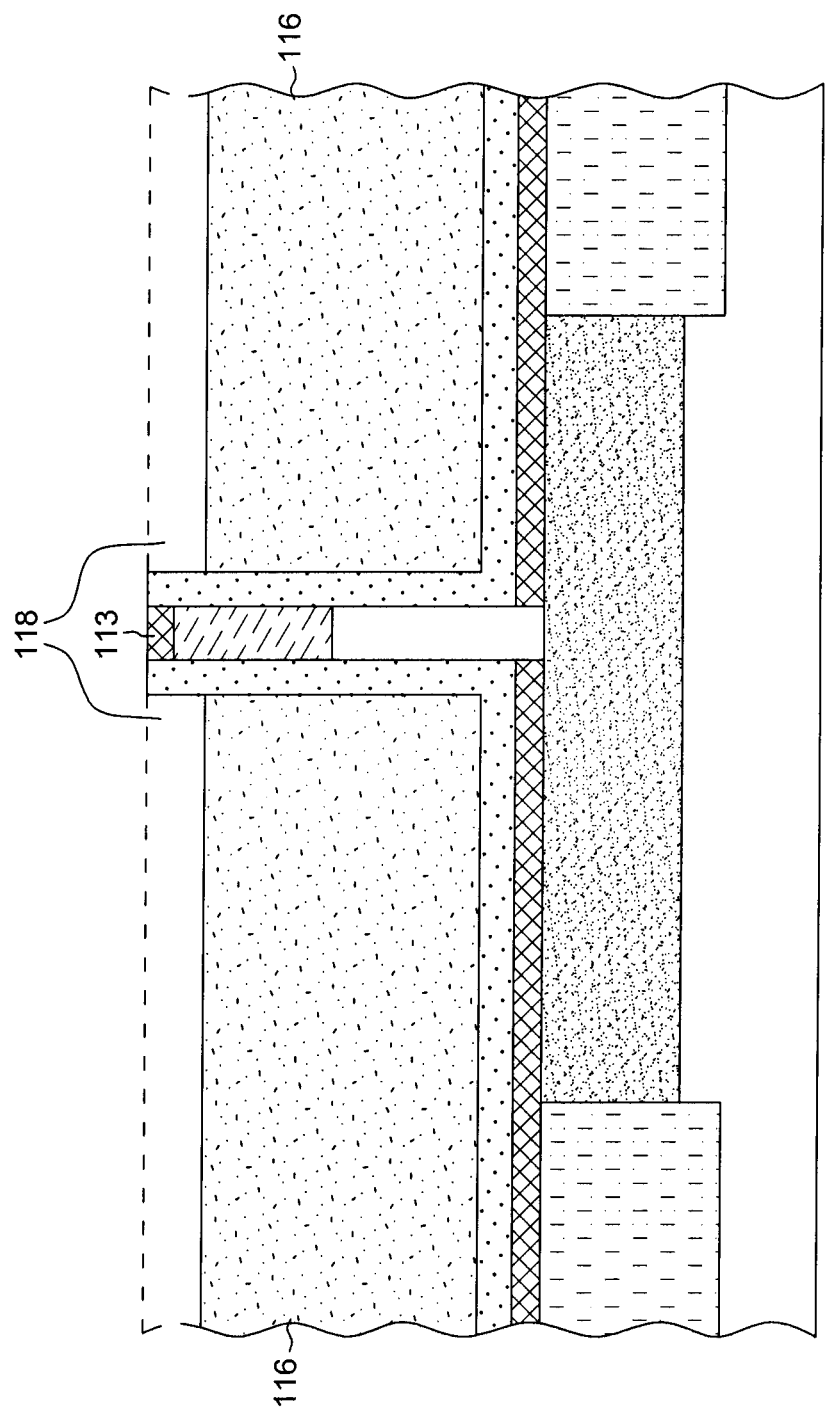
FIG. 4 depicts one example of the structure of FIG. 3 after removing a top portion of the dummy gate, in accordance with one or more aspects of the present invention.

FIG. 4 depicts one example of the structure of FIG. 3 after removing a top portion 118 of the dummy gate, in accordance with one or more aspects of the present invention.

Figure 5:
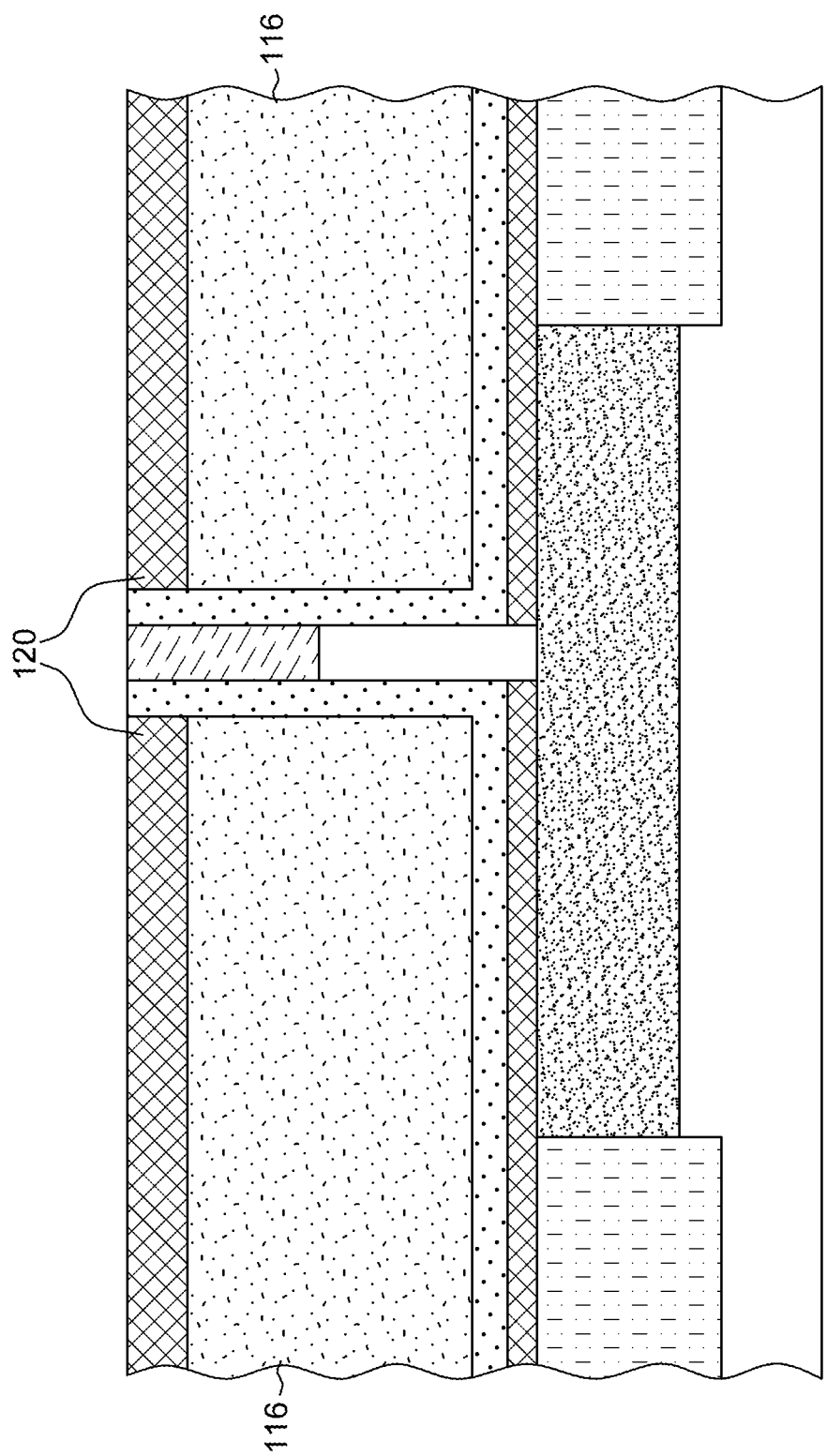
FIG. 5 depicts one example of the structure of FIG. 4 after forming a hard mask layer over the dummy gate and planarizing, in accordance with one or more aspects of the present invention.

FIG. 5 depicts one example of the structure of FIG. 4 after forming a hard mask layer 120 over the dummy gate 116 and planarizing (removes top spacer layer 113), in accordance with one or more aspects of the present invention. The hard mask layer may be formed, for example, by deposition of a dielectric thin film followed by a CMP process. An example of the dielectric film includes silicon nitride ($Si_3N_4$).

Figure 6:
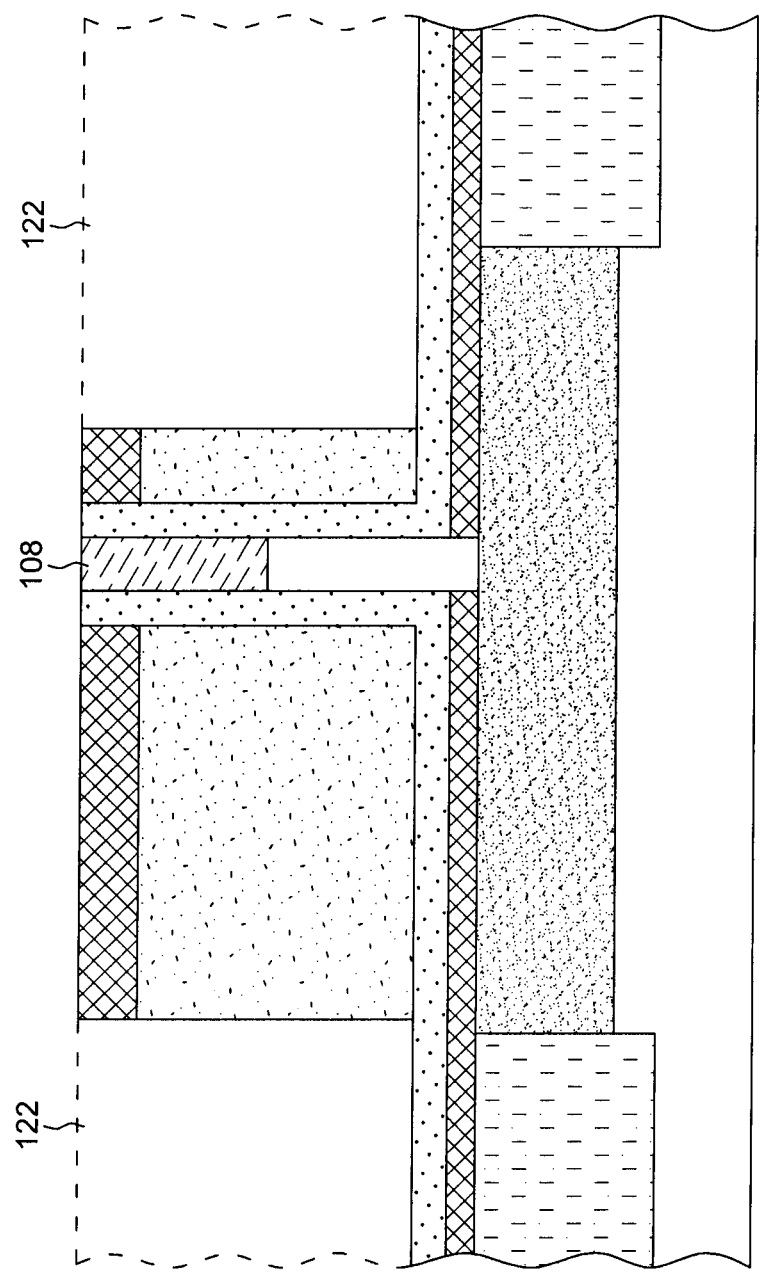
FIG. 6 depicts one example of the structure of FIG. 5 after lithographic patterning to remove unwanted portions of the dummy gate and corresponding portions of the hard mask layer, resulting in a remaining portion of the dummy gate, in accordance with one or more aspects of the present invention.

FIG. 6 depicts one example of the structure of FIG. 5 after lithographic patterning to remove unwanted portions of the dummy gate 116 and corresponding portions of the hard mask layer (generally, portions 122 of the structure), resulting in remaining portion 130 of the dummy gate, in accordance with one or more aspects of the present invention.

Figure 7:
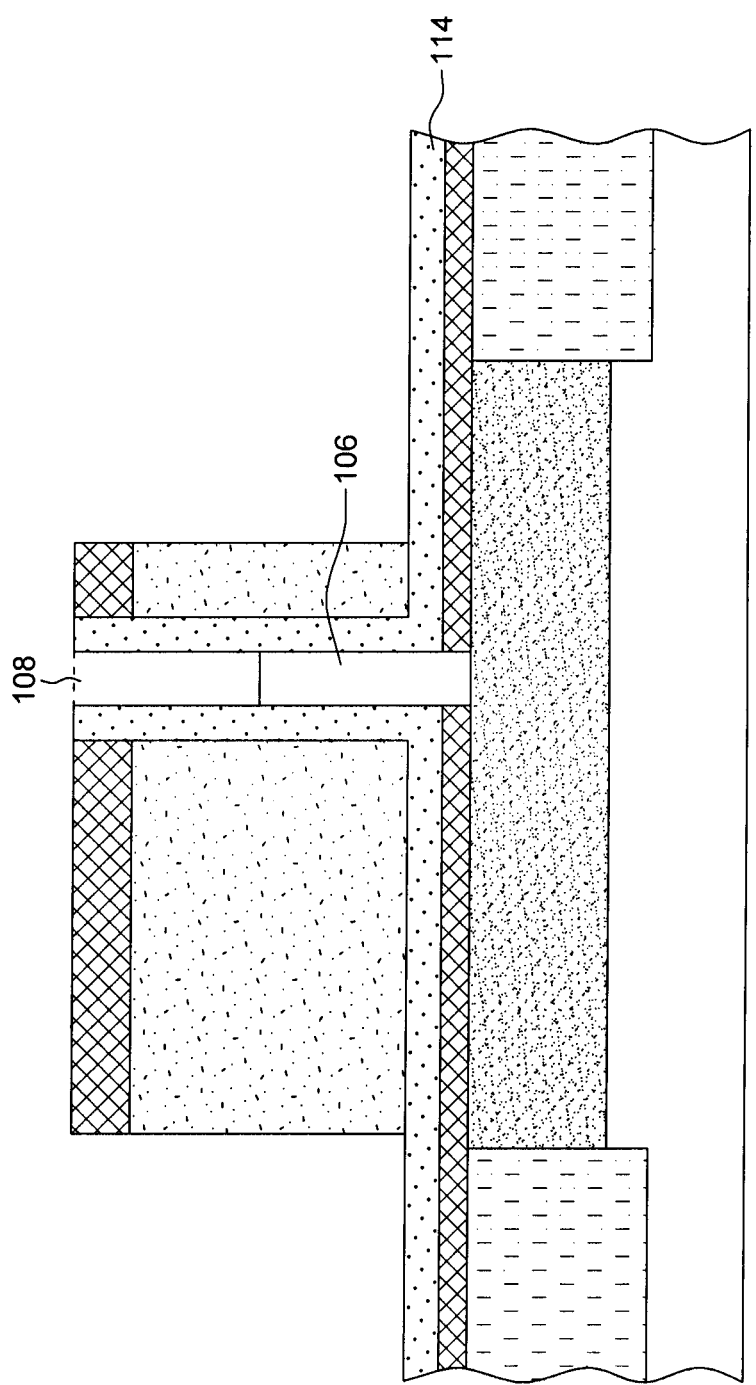
FIG. 7 depicts one example of the structure of FIG. 6 after removing the top portion of the fin, exposing the bottom portion of the fin, in accordance with one or more aspects of the present invention.

FIG. 7 depicts one example of the structure of FIG. 6 after removing the top portion 108 of the fin 105, exposing the bottom portion of the fin, in accordance with one or more aspects of the present invention. The removal of top portion 108 of the fin 105 is preferably selective to the material of the bottom portion 106 of the fin. In one example, sacrificial top portion 108 includes epitaxial silicon germanium and bottom portion 106 includes silicon. Thus, e-SiGe can be removed selective to the silicon and other surrounding materials, e.g., SiN, a-Si and $SiO_2$.

Figure 8:
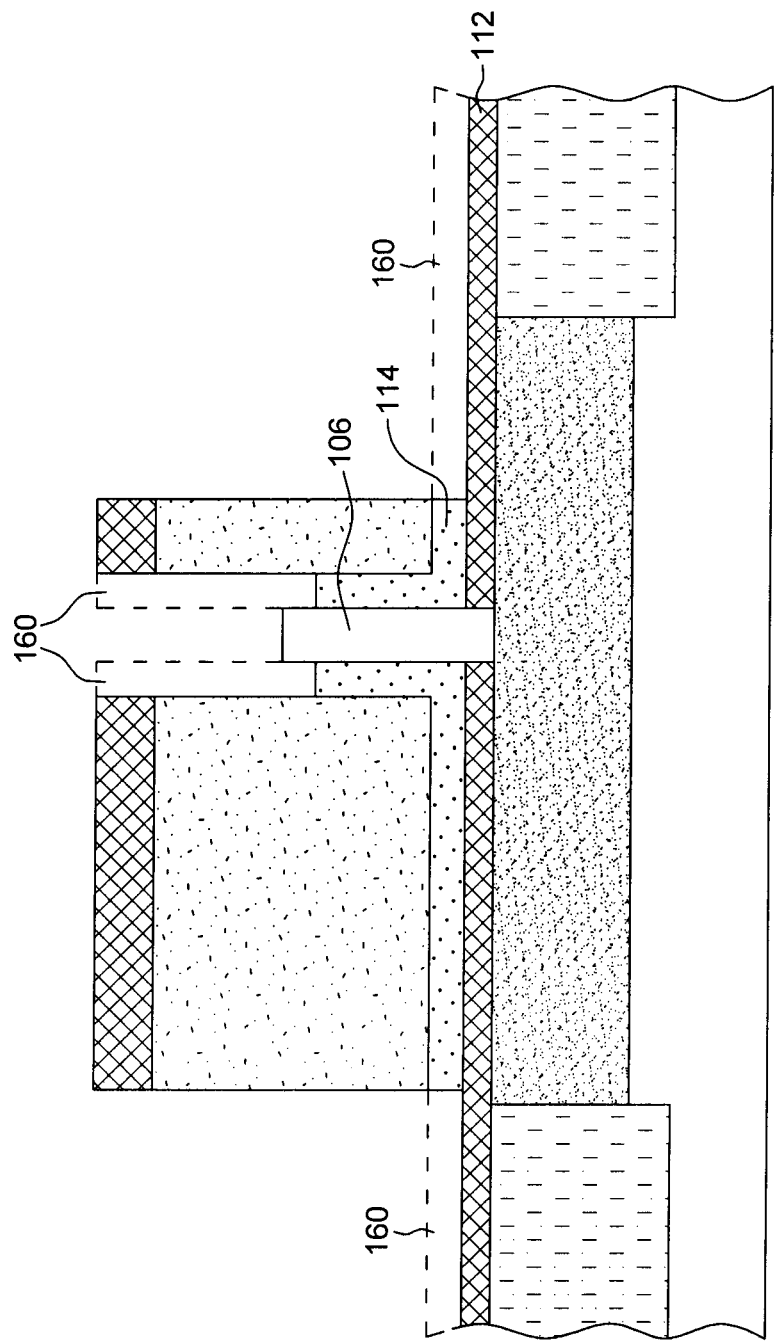
FIG. 8 depicts one example of the structure of FIG. 7 after removing exposed portions of the conformal dielectric layer, partially exposing a bottom portion of the fin(s), in accordance with one or more aspects of the present invention.

FIG. 8 depicts one example of the structure of FIG. 7 after removing exposed portions 160 of the conformal dielectric layer 114, partially exposing bottom portion 106 of the at least one fin, in accordance with one or more aspects of the present invention.

Figure 9:
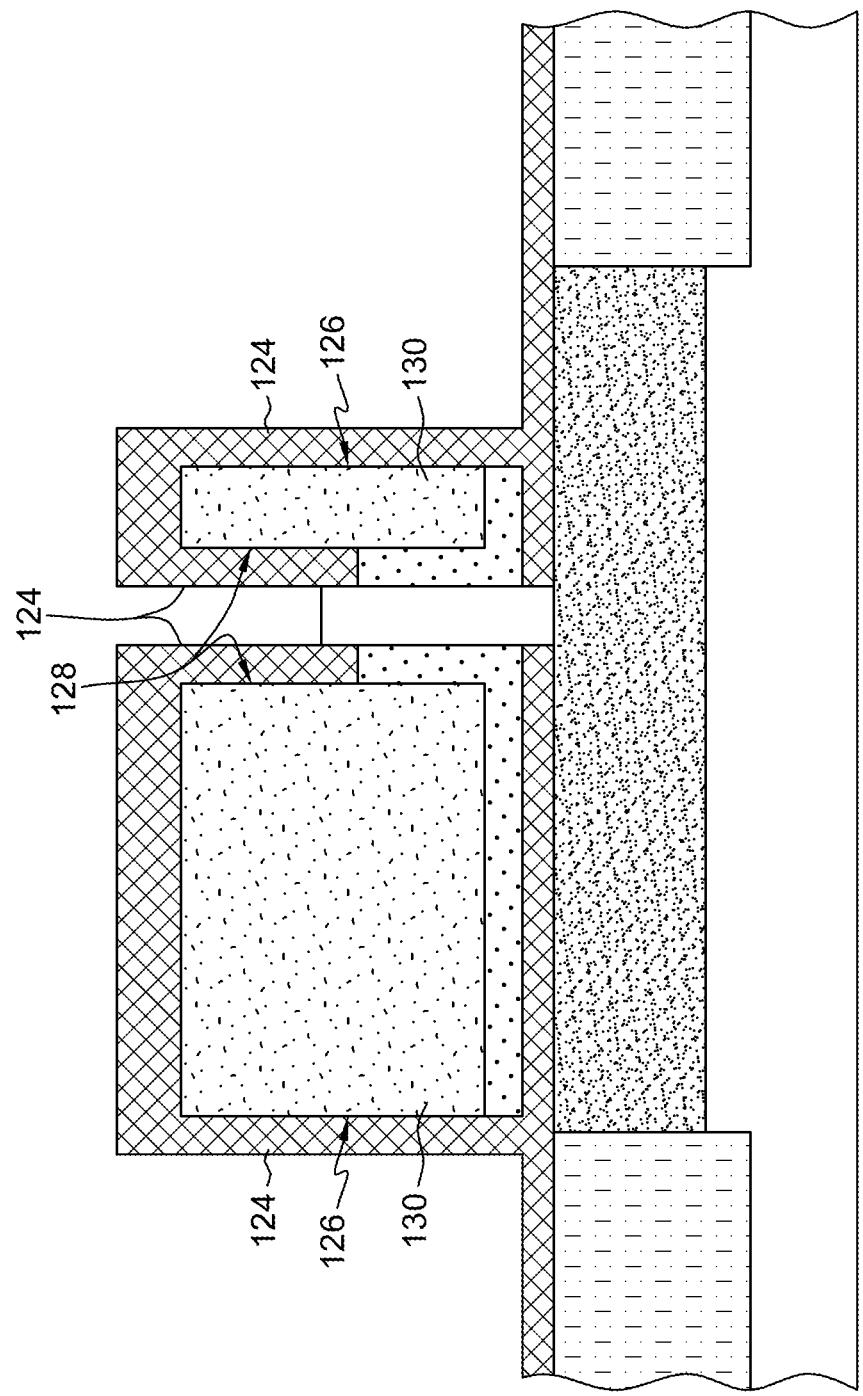
FIG. 9 depicts one example of the structure of FIG. 8 after forming spacer layers adjacent outer and inner sides of a remaining dummy gate layer, in accordance with one or more aspects of the present invention.

FIG. 9 depicts one example of the structure of FIG. 8 after forming spacer layers 124 adjacent outer 126 and inner 128 sides of a remaining dummy gate layer 130, in accordance with one or more aspects of the present invention.

Figure 10:
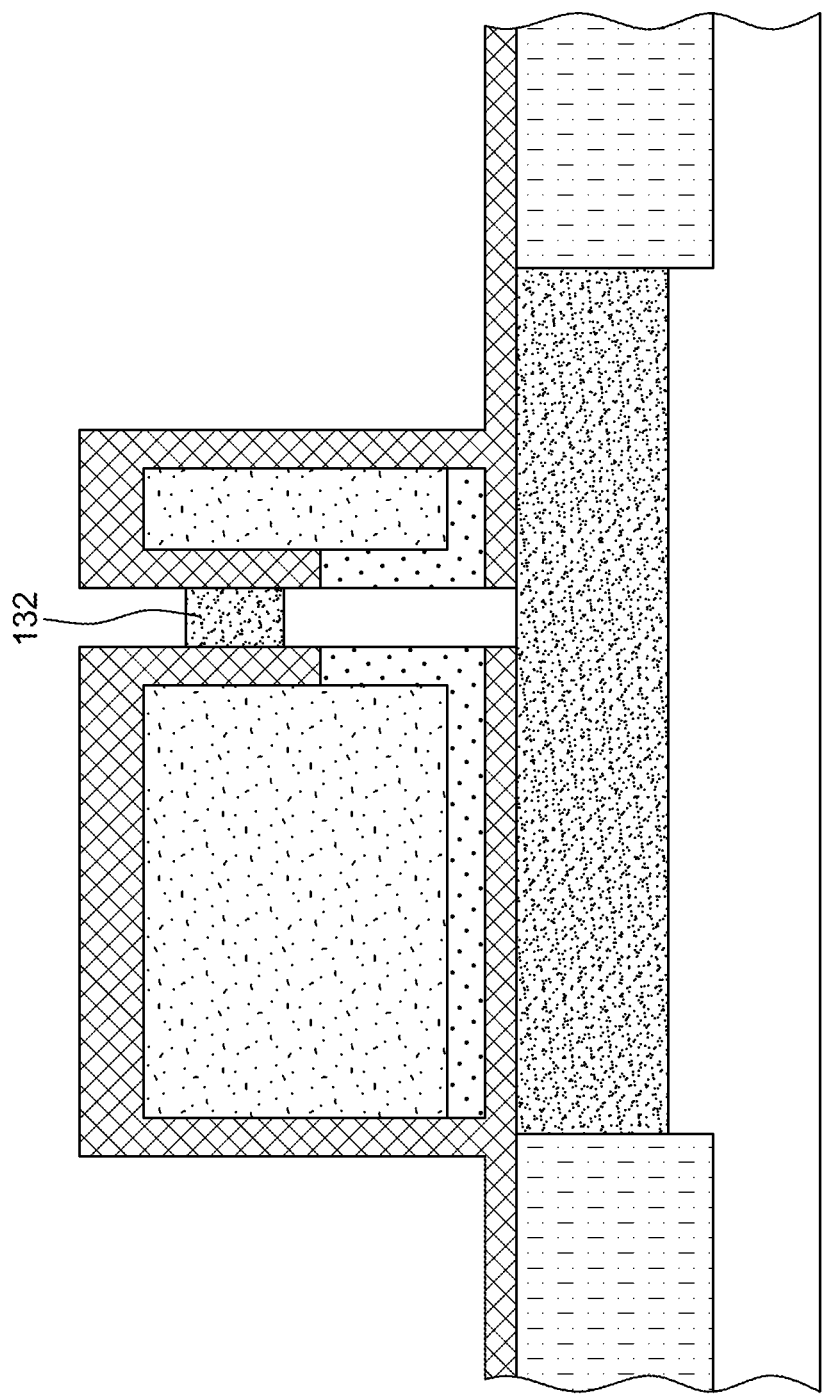
FIG. 10 depicts one example of the structure of FIG. 9 after forming a second layer of doped source/drain semiconductor material over the partially exposed portion of the exposed at least one fin, in accordance with one or more aspects of the present invention.

FIG. 10 depicts one example of the structure of FIG. 9 after forming a second layer 132 of doped source/drain semiconductor material over the partially exposed portion 122 of the exposed at least one fin, in accordance with one or more aspects of the present invention.

Figure 11:
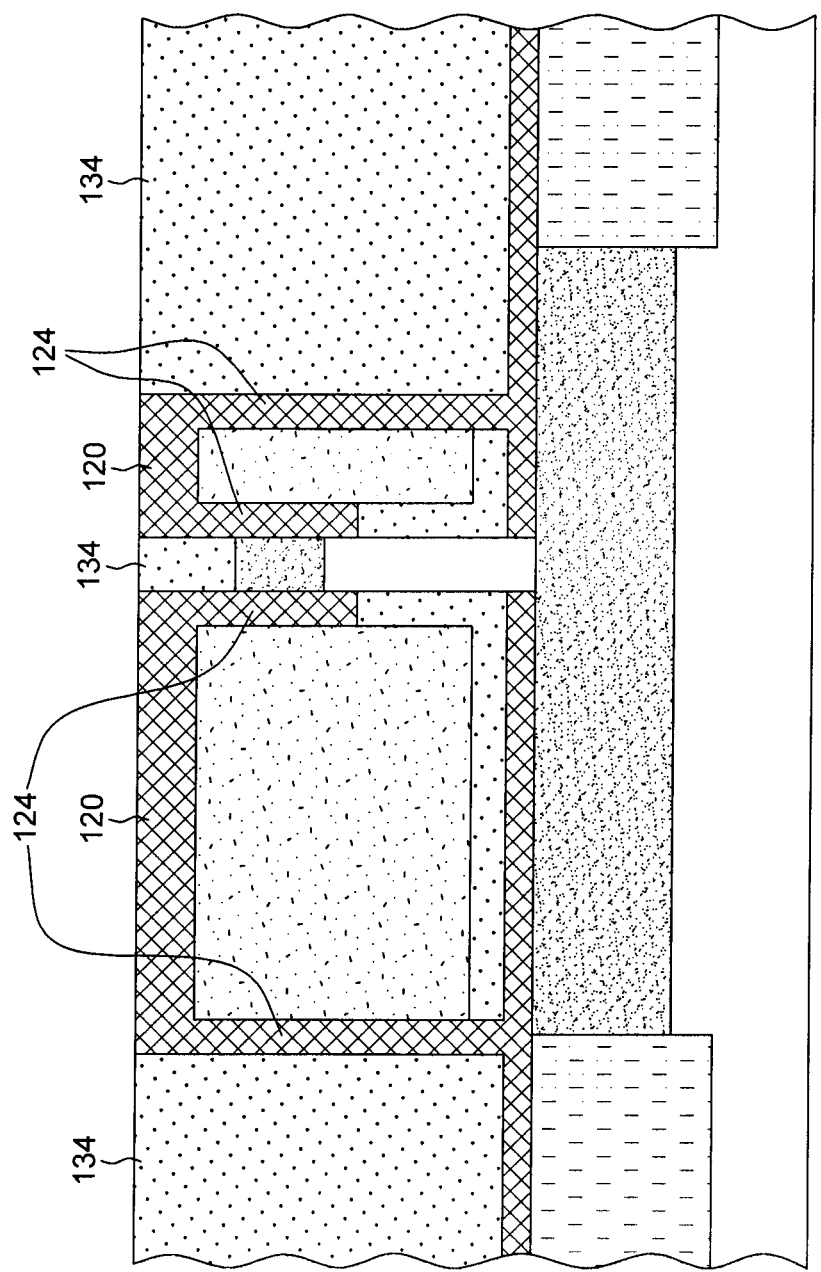
FIG. 11 depicts one example of the structure of FIG. 10 after filling in open portions of the structure with a dielectric material, in accordance with one or more aspects of the present invention.

FIG. 11 depicts one example of the structure of FIG. 10 after filling in open portions of the structure with a dielectric material 134 (e.g., $SiO_2$), in accordance with one or more aspects of the present invention.

Figure 12:
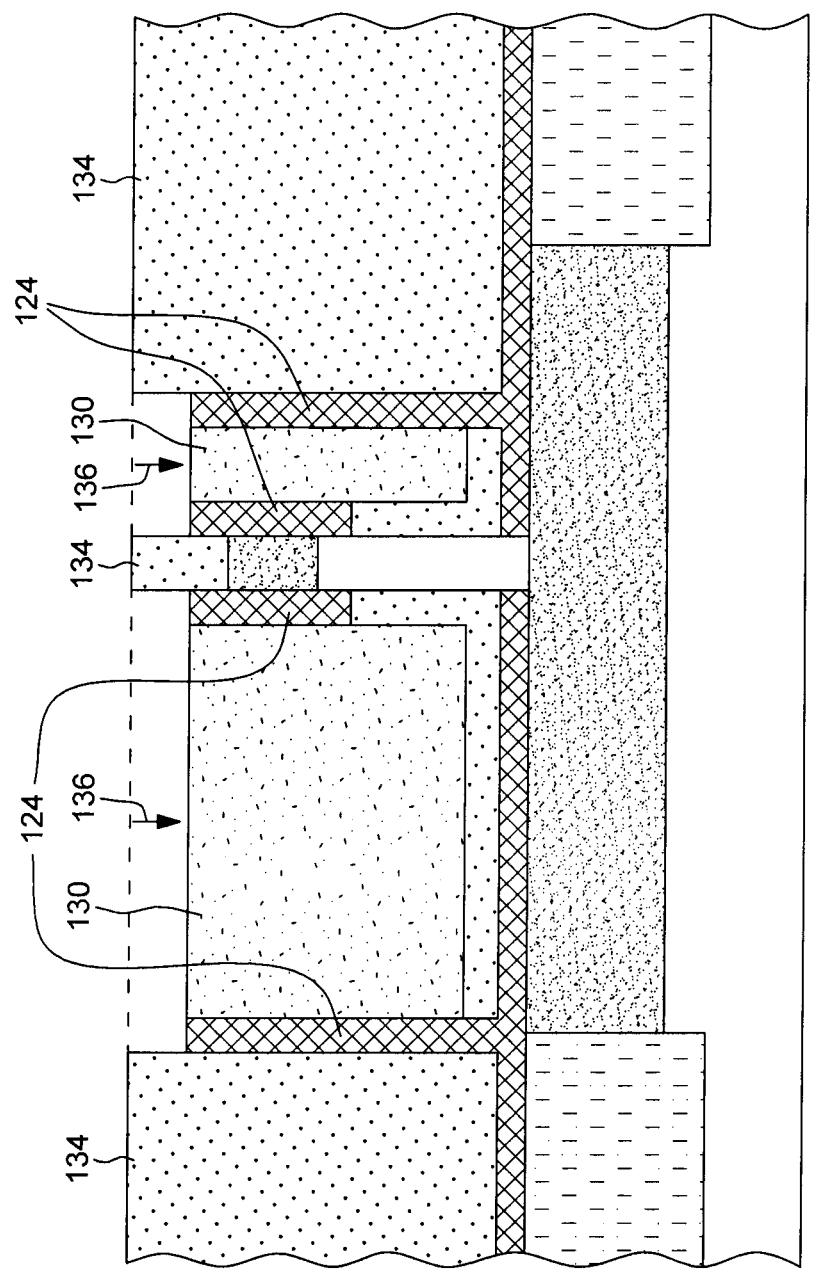
FIG. 12 depicts one example of the structure of FIG. 11 after recessing the remaining dummy gate portion and the spacer layer, in accordance with one or more aspects of the present invention.

FIG. 12 depicts one example of the structure of FIG. 11 after recessing 136 remaining dummy gate portion 130 and spacer layer 124, in accordance with one or more aspects of the present invention. In one example, the recessing may be achieved by nitride removal selective to oxide.

Figure 13:
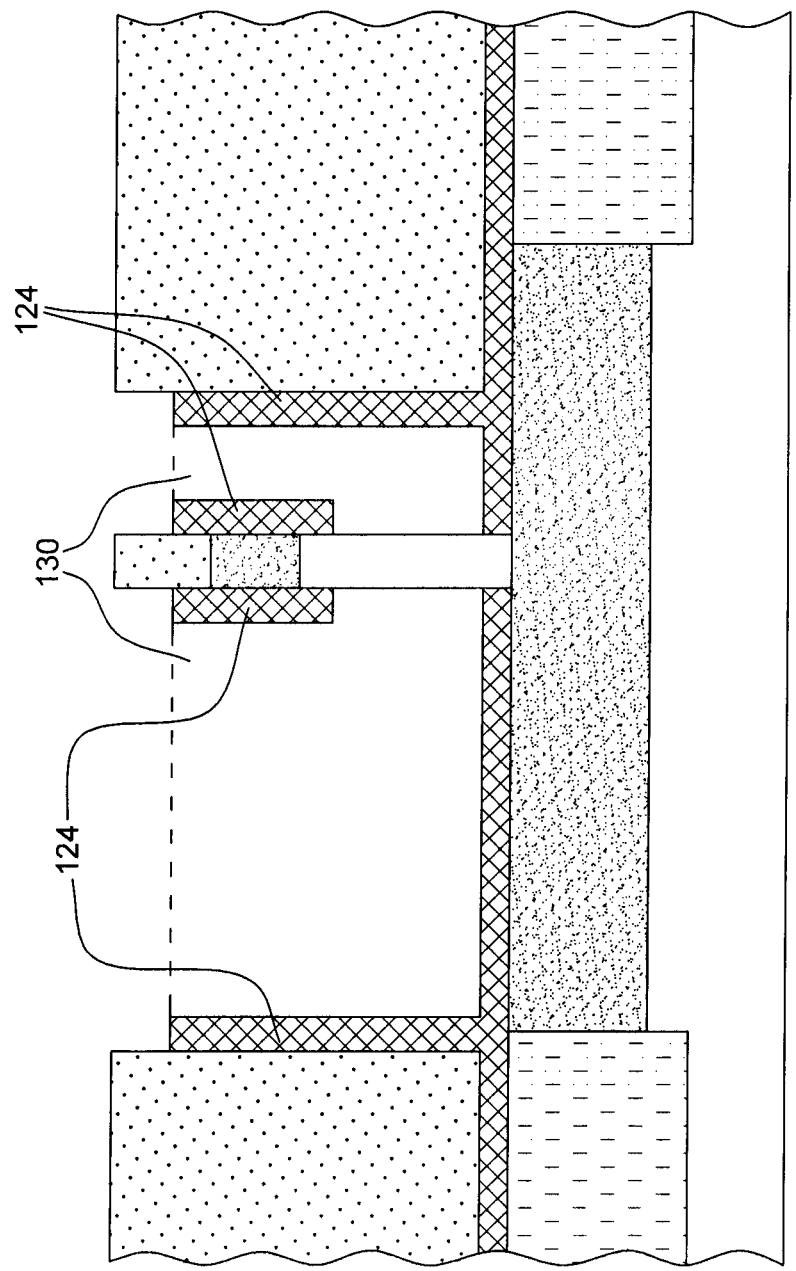
FIG. 13 depicts one example of the structure of FIG. 12 after removing a remainder of the dummy gate (e.g., a-Si) and the gate dielectric (FIG. 3, 114), in accordance with one or more aspects of the present invention.

FIG. 13 depicts one example of the structure of FIG. 12 after removing a remainder 130 of the dummy gate (e.g., a-Si) and the gate dielectric (FIG. 3, 114), in accordance with one or more aspects of the present invention.

Figure 14:
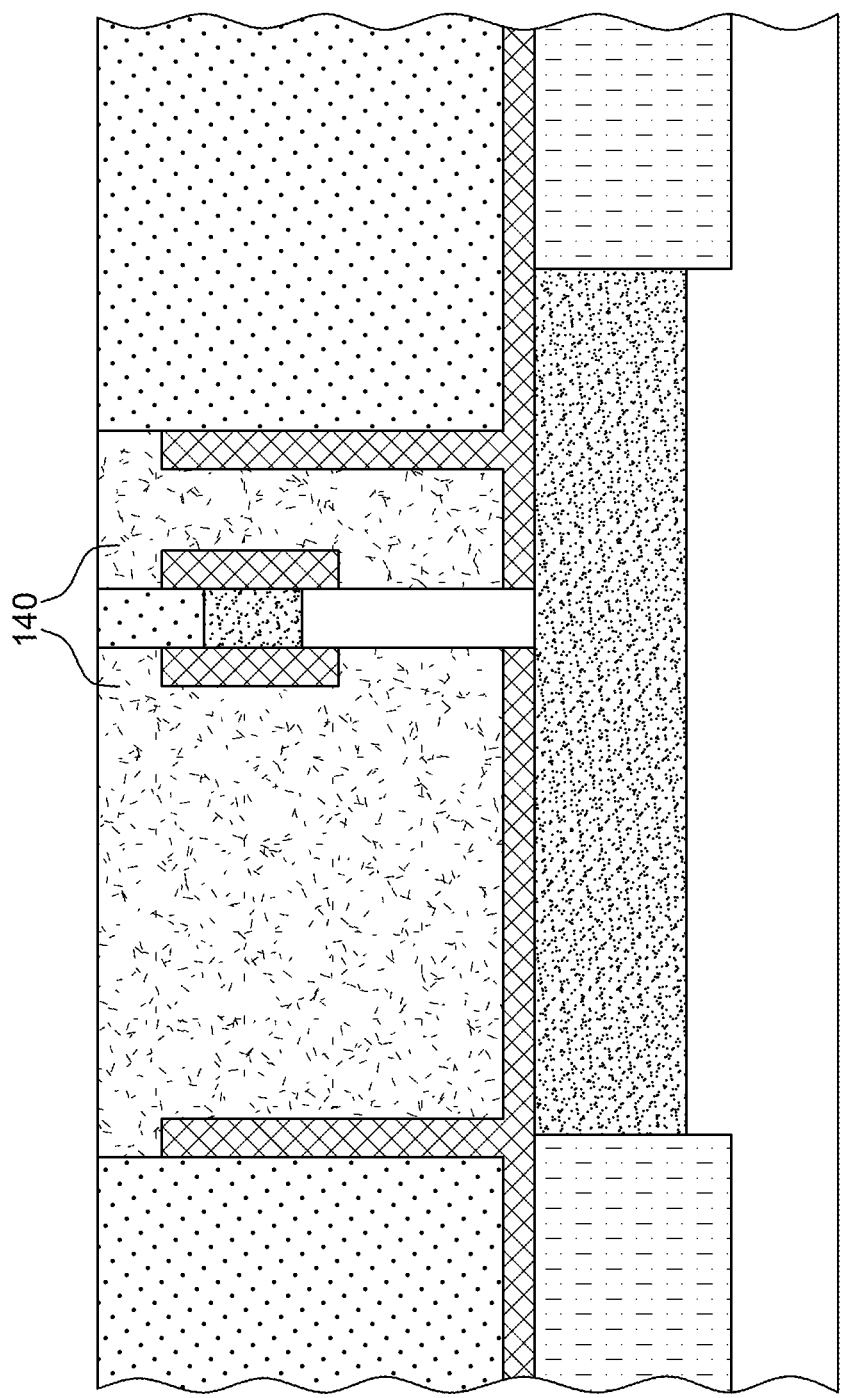
FIG. 14 depicts one example of the structure of FIG. 13 after forming a replacement metal gate, in accordance with one or more aspects of the present invention.

FIG. 14 depicts one example of the structure of FIG. 13 after forming a replacement metal gate 140, in accordance with one or more aspects of the present invention. A replacement gate typically includes a gate dielectric (e.g., $SiO_2$, SiON, $HfO_2$, $HfLaO_2$, etc.) and conductive materials (e.g., work function metals such as tungsten, aluminum, copper, ruthenium, etc.). Examples of work function metals include TiN, TiC, TiAl, TaN, TaC, etc.

Figure 15:
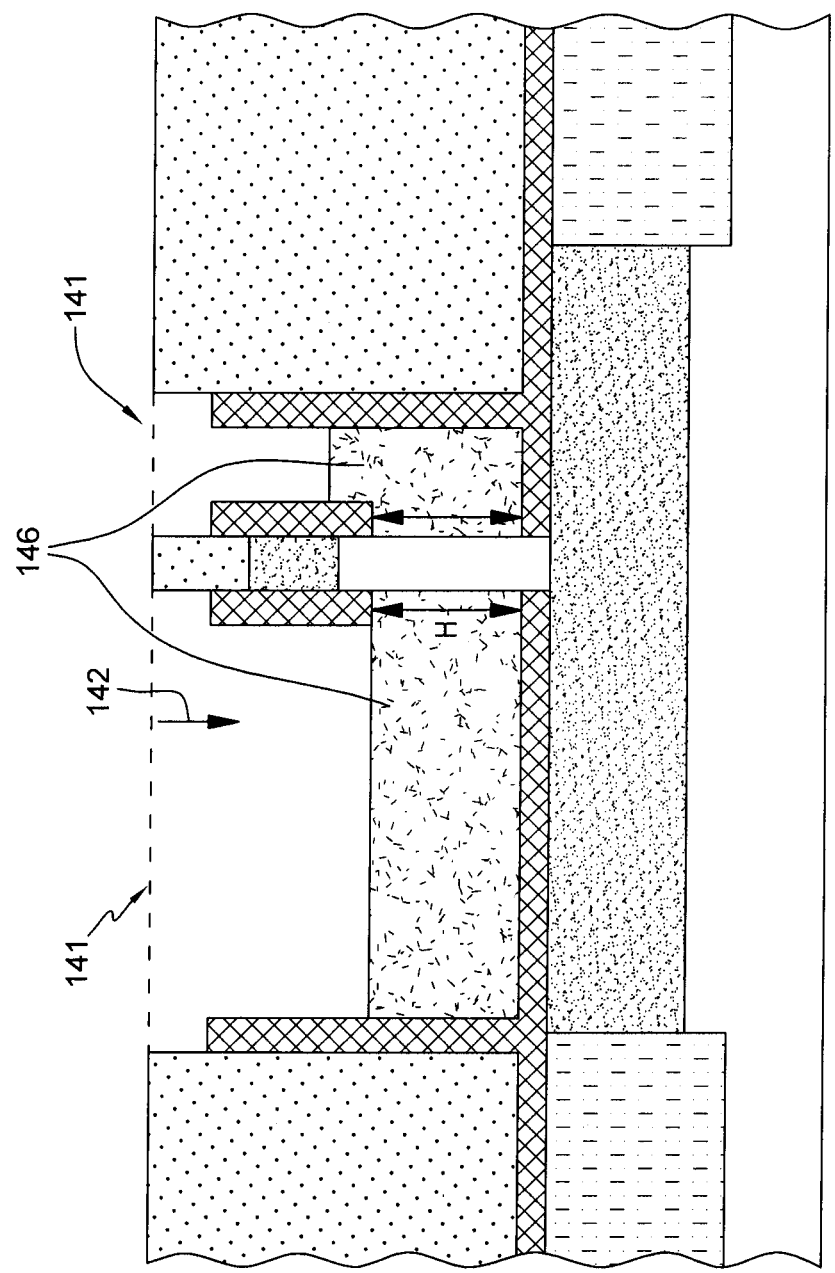
FIG. 15 depicts one example of the structure of FIG. 14 after recessing the metal gate, in accordance with one or more aspects of the present invention.

FIG. 15 depicts one example of the structure of FIG. 14 after recessing 142 the metal gate, in accordance with one or more aspects of the present invention. It should be noted that by pre-defining the gate length with the initial bottom FIN portion height, the actual gate length will not be impacted by non-uniform replacement gate recess as shown in FIG. 15.

Figure 16:
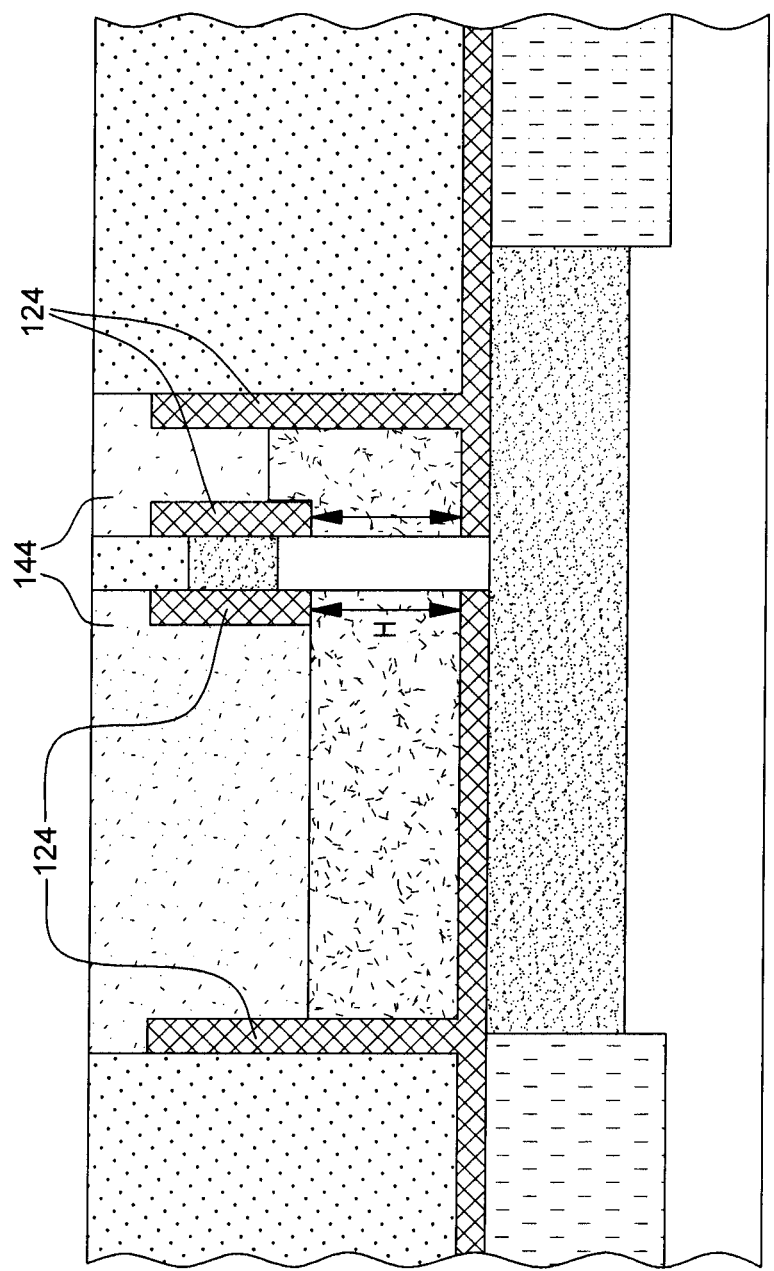
FIG. 16 depicts one example of the structure of FIG. 15 after filling in open areas, resulting from recessing the metal gate, with a dielectric material, in accordance with one or more aspects of the present invention.

FIG. 16 depicts one example of the structure of FIG. 15 after filling in open areas (FIG. 15, 141), the open areas resulting from recessing 142 the metal gate, with a dielectric material 144, in accordance with one or more aspects of the present invention.

Figure 17:
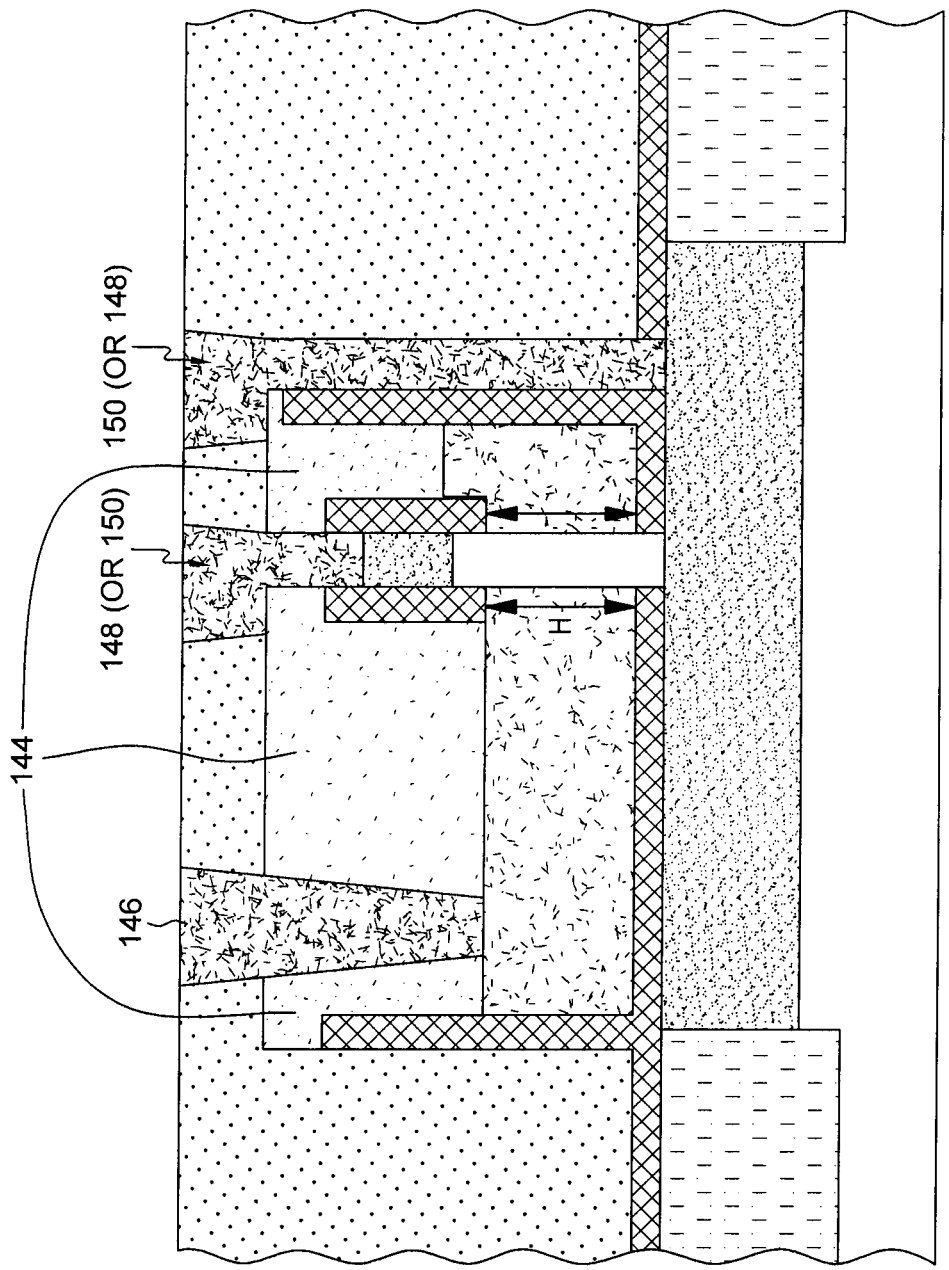
FIG. 17 depicts one example of the structure of FIG. 16 after forming contacts to the metal gate, the source and the drain, in accordance with one or more aspects of the present invention.

FIG. 17 depicts one example of the structure of FIG. 16 after forming contacts to the metal gate 146, the source (148 or 150) and the drain (150, 148), in accordance with one or more aspects of the present invention.

In a first aspect, disclosed above is a method. The method includes providing a semiconductor substrate with a bottom source/drain layer thereover, forming a vertical channel over the bottom source/drain layer, forming a dummy gate wrapped around the vertical channel, and forming a bottom spacer layer and a top spacer layer around a top portion and a bottom portion, respectively, of the vertical channel, a remaining center portion of the vertical channel defining a fixed vertical channel height. The method further includes forming a top source/drain layer over the vertical channel, replacing the dummy gate with a metal gate, and forming self-aligned source, drain and gate contacts.

In one example, forming the dummy gate may include, for example, forming a first hard mask layer on horizontal surfaces of the starting semiconductor structure, forming a conformal dielectric layer over the first hard mask layer and along vertical sides of the fin(s), and forming a dummy gate adjacent vertical portions of the conformal dielectric layer. In one example, forming the first hard mask layer may include, for example, using a gas cluster ion beam process. In one example, forming the first hard mask layer may include, for example, forming the first hard mask layer to a height of about 5 nm to about 15 nm.

In one example, forming the vertical channel in the method of the first aspect may include, for example, forming a fin over the bottom source/drain layer, the fin including a bottom portion of semiconductor channel material and a top portion of sacrificial epitaxial semiconductor material. In one example, forming the dummy gate may include, for example, replacing a top portion of the dummy gate with a second hard mask layer, removing portions of the dummy gate, corresponding portions of the second hard mask layer and the top portion of the fin(s), exposing portions of the conformal dielectric layer and the bottom portion of the fin(s), removing the exposed portions of the conformal dielectric layer, partially exposing sides of the bottom portion of the fin(s), and forming vertical hard mask layers adjacent outer and inner sides of a remaining dummy gate layer. In one example, removing portions of the dummy gate may include, for example, removing non-uniform portions of the dummy gate.

In one example, removing the top portion of the fin(s) may include, for example, removal thereof selective to the bottom portion of the fin(s).

In one example, forming a top source/drain layer over the vertical channel may include, for example, forming a second layer of doped source/drain semiconductor material over the partially exposed fin(s) and filling in open portions of the structure with a dielectric material, and recessing all but the dielectric material used for the filling.

In one example, the method may further include, for example, filling in open areas with a metal gate stack, resulting from recessing the metal gate stack, with a dielectric material.

In a second aspect, disclosed above is a semiconductor structure. The semiconductor structure includes a semiconductor substrate, a bottom source/drain layer for a first vertical transistor over the semiconductor substrate, a vertical channel over the source/drain layer, and a metal gate wrapped around the vertical channel, the vertical channel having a fixed height relative to the metal gate at an interface therebetween. The semiconductor structure further includes a top source/drain layer over the vertical channel, and a self-aligned contact to each of the top and bottom source/drain layer and the gate.

In one example, the metal gate may, for example, lack height uniformity beyond the interface within the vertical channel.

In one example, the semiconductor substrate of the second aspect may further include, for example, hard mask material surrounding the metal gate.

In one example, the semiconductor substrate of the second aspect may further include, for example, a second vertical transistor with a fixed-height vertical channel different from that of the first vertical transistor. In one example, a metal gate of the second vertical transistor may have, for example, a uniform height.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of forming semiconductor structures, comprising:
   providing a starting semiconductor structure, the starting semiconductor structure comprising a substrate with a bottom source/drain layer and forming a vertical channel over the bottom source/drain layer, wherein forming the vertical channel comprises forming a fin over the bottom source/drain layer, the fin comprising a bottom portion of semiconductor channel material and a top portion of sacrificial epitaxial semiconductor material;
   forming a dummy gate wrapped around the vertical channel;
   forming a bottom spacer layer and a top spacer layer around a bottom portion and a top portion, respectively, of the vertical channel, a remaining center portion of the vertical channel defining a fixed vertical channel height;
   forming a top source/drain layer over the vertical channel;
   replacing the dummy gate with a metal gate; and
   forming self-aligned source, drain and gate contacts.

2. The method of claim 1, wherein forming the dummy gate comprises:
   forming the bottom spacer as a first hard mask layer on horizontal surfaces of the starting semiconductor structure;
   forming a conformal dielectric layer over the first hard mask layer and along vertical sides of the vertical channel; and
   forming the dummy gate adjacent vertical portions of the conformal dielectric layer.

3. The method of claim 2, wherein forming the first hard mask layer comprises using a gas cluster ion beam process.

4. The method of claim 3, wherein forming the first hard mask layer comprises forming the first hard mask layer to a height of about 5 nm to about 15 nm.

5. The method of claim 1, wherein forming the dummy gate comprises:
   forming the bottom spacer as a first hard mask layer on horizontal surfaces of the starting semiconductor structure;
   forming a conformal dielectric layer over the first hard mask layer and along vertical sides of the vertical channel;
   replacing a top portion of the dummy gate with a hard mask layer;
   removing portions of the dummy gate, corresponding portions of the hard mask layer and the top portion of sacrificial epitaxial semiconductor material, exposing portions of the conformal dielectric layer and the bottom portion of semiconductor channel material;
   removing the exposed portions of the conformal dielectric layer, partially exposing sides of the bottom portion of semiconductor channel material; and
   forming vertical spacer layers adjacent outer and inner sides of a remaining portion of the dummy gate, resulting in an intermediate semiconductor structure.

6. The method of claim 5, wherein removing portions of the dummy gate comprises removing non-uniform portions of the dummy gate.

7. The method of claim 5, wherein removing the top portion of sacrificial epitaxial semiconductor material comprises removal thereof selective to the bottom portion of semiconductor channel material.

8. The method of claim 5, wherein forming the top source/drain layer over the vertical channel comprises:
   forming a layer of doped source/drain semiconductor material over the bottom portion of semiconductor channel material and filling in open portions of the intermediate semiconductor structure with a dielectric material; and
   recessing a remaining portion of the dummy gate and the vertical spacer layers.

9. The method of claim 8, further comprising:
   etching the remaining portion of the dummy gate to form open areas;
   filling in the open areas with a metal gate stack;
   recessing a top portion of the metal gate stack, and
   forming a dielectric material on a remaining portion of the metal gate stack.

10. A semiconductor structure comprising:
    a semiconductor substrate;
    a bottom source/drain layer for a first vertical transistor over the semiconductor substrate;
    a fin coupled to the bottom source/drain layer, the fin comprising a vertical channel over the bottom source/drain layer;
    a metal gate stack comprising a conductive material and a gate dielectric;

wherein a first portion of the metal gate stack has a first height, and the first portion of the metal gate stack is wrapped around the vertical channel; a second portion of the metal gate stack is formed adjacent the vertical channel with the first portion of the metal gate stack interposed between the second portion of the metal gate stack and the vertical channel;

wherein the second portion of the metal gate stack has a second height, the second height of the second portion of the metal gate stack is greater than the first height of the first portion of the metal gate stack;

a top source/drain layer over the vertical channel; and a self-aligned contact to each of the top and bottom source/drain layer and the metal gate stack.

11. The semiconductor structure of claim 10, further comprising hard mask material surrounding the metal gate stack.

12. The semiconductor structure of claim 10, further comprising a second vertical transistor with a vertical channel having a height different from that of the first vertical transistor.

13. The semiconductor structure of claim 12, wherein a metal gate of the second vertical transistor has a uniform height.

* * * * *